(12) United States Patent
Roberts et al.

(10) Patent No.: US 7,632,625 B2
(45) Date of Patent: Dec. 15, 2009

(54) METHOD OF PRE-EXPOSING RELIEF IMAGE PRINTING PLATE

(76) Inventors: David H. Roberts, 2704 Levante St., Carlsbad, CA (US) 92009; Gregory E. Mueller, 1770 Cottage Grove Dr., Encinitas, CA (US) 92024

( * ) Notice: Subject to any disclaimer, the term of this patent is extended or adjusted under 35 U.S.C. 154(b) by 528 days.

(21) Appl. No.: 10/853,342

(22) Filed: May 25, 2004

(65) Prior Publication Data

US 2005/0266358 A1    Dec. 1, 2005

(51) Int. Cl.
G03F 7/26    (2006.01)
(52) U.S. Cl. ...................................... 430/306
(58) Field of Classification Search ........ 430/494, 430/322, 327, 302, 306, 394
See application file for complete search history.

(56) References Cited

U.S. PATENT DOCUMENTS

| | | | |
|---|---|---|---|
| 3,859,091 A | | 1/1975 | Wessells et al. |
| 4,046,071 A * | | 9/1977 | Mizuno et al. ............. 101/395 |
| 4,414,312 A | | 11/1983 | Goff et al. |
| 4,501,811 A * | | 2/1985 | Saikawa et al. ............ 430/204 |
| 4,540,649 A | | 9/1985 | Sakurai |
| 4,717,650 A * | | 1/1988 | Ikeda et al. ................. 430/494 |
| 4,804,611 A * | | 2/1989 | Geis ............................ 430/138 |
| 5,134,058 A * | | 7/1992 | Han ............................ 430/327 |
| 5,330,882 A | | 7/1994 | Kawaguchi et al. |
| 5,455,416 A | | 10/1995 | Zertani et al. |
| 5,645,974 A | | 7/1997 | Ohta et al. |
| 5,976,763 A | | 11/1999 | Roberts et al. |
| 6,599,676 B2 * | | 7/2003 | Savariar-Hauck et al. 430/270.1 |
| 7,150,949 B2 * | | 12/2006 | Askebjer et al. ............. 430/30 |
| 2002/0029711 A1 * | | 3/2002 | D'Amato .................... 101/467 |
| 2003/0233955 A1 * | | 12/2003 | Mori ......................... 101/454 |
| 2004/0081908 A1 * | | 4/2004 | Shimazu et al. ............. 430/152 |
| 2004/0234886 A1 | | 11/2004 | Rudolph et al. |
| 2006/0019193 A1 | | 1/2006 | Roberts et al. |

FOREIGN PATENT DOCUMENTS

EP    0460919    *    6/1991
EP    0 456 336 B1    6/1997

* cited by examiner

*Primary Examiner*—Kathleen Duda
*Assistant Examiner*—Brittany Raymond
(74) *Attorney, Agent, or Firm*—Carmody & Torrance LLP

(57) ABSTRACT

The present invention is directed to a method of selectively pre-exposing a photosensitive printing element prior to imagewise exposure in order to remove oxygen from the photosensitive layer prior to imagewise exposure. The invention is usable in a computer-to-plate process to produce flexographic relief image printing elements.

13 Claims, No Drawings

METHOD OF PRE-EXPOSING RELIEF IMAGE PRINTING PLATE

FIELD OF THE INVENTION

The present invention is directed to a method of selectively pre-exposing a photosensitive printing element prior to imagewise exposure in order to remove oxygen from the photosensitive layer prior to imagewise exposure.

BACKGROUND OF THE INVENTION

Flexographic printing is widely used in the production of newspapers and in the decorative printing of packaging media. Photosensitive printing plates and cylindrical printing sleeves have been developed to meet the demand for fast, inexpensive processing and long press runs.

Solid photocurable elements can exist as cylinders or rectilinear sheets. The photocurable element comprises a substrate, one or more photocurable layers, and often a protective cover sheet. The protective cover sheet is formed from plastic or any other removable material that can protect the plate or photocurable element from damage until it is ready for use. The photocurable element can optionally comprise a slip film disposed between the protective cover sheet and the photocurable layer(s) to protect the plate from contamination, increase ease of handling, and act as an ink-accepting layer.

The use of a photosensitive printing medium for the manufacture of flexographic printing elements, including plates and sleeves, is described in general terms as follows. The photosensitive resin printing material is deposited onto a substrate to form a printing element. The photosensitive resin may be deposited onto the substrate in a variety of ways, e.g., by extrusion, roll coating, heat processing, solvent casting, and the like. These techniques can be readily carried out by those skilled in the art.

The desired image is produced on the printing plate by exposing selected portions of the resin to actinic radiation. Selective exposure of the photosensitive resin can be achieved for example, by the use of an image-bearing transparency such as a negative film on the surface of the photosensitive layer, through the front side of the photosensitive resin. Areas of the transparency opaque to actinic radiation prevent the initiation of free-radical polymerization within the photosensitive layer directly beneath the transparency. Transparent areas of the image-bearing element will allow the penetration of actinic radiation into the photosensitive layer, initiating free-radical polymerization, rendering those areas insoluble in the processing solvent. Alternatively, exposure of selected portions of the photosensitive layer to laser radiation or other focused radiation beam may also initiate free-radical polymerization, rendering those areas insoluble in the processing solvent.

The unexposed and therefore unhardened portions of the resin are selectively removed by using a development process such as washing in a suitable solvent or thermal blotting. Washing may be accomplished by a variety of processes, including brushing, spraying, or immersion. The resulting surface has a relief pattern that reproduces the image to be printed. The printing element is mounted on a press and printing commences.

The support sheet, or backing layer, can be formed from a transparent or opaque material such as paper, cellulose film, plastic, or metal. Preferred substrate materials include steel, copper, or aluminum sheets, plates, or foils; paper; or films or sheets made from synthetic polymeric materials such as polyesters, polystyrene, polyolefins, polyamides, and the like. The support sheet can optionally comprise an adhesive layer for more secure attachment to the photocurable layer(s).

The photosensitive layer(s) can include a variety of known materials, such as polymers, initiators, reactive diluents, fillers, and dyes. Preferred photosensitive compositions include an elastomer compound, an ethylenically unsaturated compound having at least one terminal ethylenic group, and a photoinitiator. Such materials are described in numerous patents and publications and are well known to those skilled in the art.

The photosensitive materials of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions. Preferred actinic wavelength regions are from about 320 nm to about 450 nm, more preferably from about 355 nm to about 415 nm.

As discussed above, photosensitive resin compositions generally cure through radical polymerization, upon exposure to light. The curing reaction is inhibited by oxygen, which is dissolved in the resin compositions, because oxygen functions as a radical scavenger. It is therefore highly preferred that the dissolved oxygen be removed from the photosensitive resin composition prior to exposure. Various techniques have been suggested for removing dissolved oxygen from the photosensitive resin composition. For example, the photosensitive resin composition may be placed in an atmosphere of inert gas (e.g. carbon dioxide or nitrogen) overnight before exposure in order to replace the dissolved oxygen with the inert gas by way of diffusion. The drawback to this method is that it can take a long time and requires a large space for the necessary machinery.

Alternatively, the photosensitive resin printing element may be given a weak blanket "pre-exposure" to consume the dissolved oxygen prior to subjecting the printing element to the main image-wise exposure. This pre-exposure step is often called a "bump" exposure. The bump exposure is applied to the entire plate area and is a short, low dose exposure of the plate that ostensibly reduces oxygen, which inhibits photopolymerization of the plate (or other printing element). Without this pre-sensitization step, fine features (i.e., highlight dots, fine lines, isolated dots, etc.) are not preserved on the finished plate. However, the pre-sensitization step tends to cause shadow tones to fill in, causing the printed gamut to be significantly reduced. This is exacerbated in plate formulations that have very high sensitivity and small exposure latitude. An additional drawback to this method is that the bump exposure requires specific conditions, including exposure time, irradiated light density, and the like, so that only the dissolved oxygen is quenched.

The pre-sensitization effect also wears off as the elapsed time between the bump exposure and main exposure increases. In conventional exposure of a printing plate, the elapsed time between the bump exposure and the main exposure is typically greater than about 20 seconds, allowing some oxygen to re-enter the plate prior to the main exposure. This delay causes the finished plate to have deep shadows. On the other hand, if the main exposure is applied very soon after the pre-sensitization step, as is envisioned in a computer-to-plate process, the tendency of shadow tones to fill is further worsened in comparison with conventional exposure techniques.

Other efforts to improve the relief image printing plate have involved special plate formulations alone or in combination with the bump exposure.

For example, U.S. Pat. No. 5,330,882 to Kawaguchi et al., incorporated herein by reference in its entirety, describes a photosensitive resin composition that comprises a polymer binder, a radically polymerizable monomer, a sensitizing dye, and a polymerization initiator wherein the preliminary (bump) exposure is conducted with a light that only excites the sensitizing dye and the main exposure is conducted with a light that excites the photopolymerization initiator. In this instance, the preliminary exposure is conducted with a light only exciting the sensitizing dye, and the main exposure is conducted with a light exciting the photopolymerization initiator.

U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative. According to the inventors, the composition eliminates the need for pre-exposure conditioning and produces a chemically and thermally stable plate.

U.S. Pat. No. 5,645,974 to Ohta et al., incorporated herein by reference in its entirety, discloses a photocurable mixture that includes paraffin or a similar waxy substance to inhibit the effect of atmospheric oxygen. Due to its low solubility in the polymer, the paraffin floats at the beginning of the polymerization and forms a transparent surface layer that prevents the ingress of air.

Although various methods of inhibiting/removing dissolved oxygen in the photosensitive resin composition have been suggested, there remains a need in the art for an improved method of removing dissolved oxygen, especially in computer-to-plate (CTP) processes.

SUMMARY OF THE INVENTION

The inventors here have discovered an improved process for the imagewise exposure of photopolymers which process overcomes the deleterious effects of oxygen in the photopolymer. In accordance with this new process the photopolymer is selectively exposed to actinic radiation which is of sufficient intensity to quench the oxygen in the photopolymer, particularly in areas where fine features are to be developed, but which is not at an intensity that will cure the photopolymer. Thus certain areas of the photopolymer, such as fine feature areas, are pre-sensitized, while other areas, such as shadow areas, are not or are to a lesser extent. The reasoning behind this is that in the fine feature areas the pre-sensitization radiation quenches the dissolved oxygen, which would inhibit the effective exposure and development of these fine features, but pre-sensitization is avoided or lessened in shadow areas where the pre-sensitization radiation would fill in the shadows. This new process therefore achieves the goals of pre-sensitization without experiencing the detriments of the prior art, namely oxygen inhibition or filling in of shadow areas. Various methods of achieving selective pre-sensitization are disclosed herein.

DETAILED DESCRIPTION OF THE PREFERRED EMBODIMENTS OF THE INVENTION

The inventors have surprisingly discovered that an improved relief image printing element can be obtained when the bump exposure is selectively (preferentially) applied to the photosensitive substrate. In one embodiment, the printing element is processed in a CTP device. Thus, in order to achieve a better printing surface, i.e., with less fill in of shadow tones and thus greater definition on the printing surface, the inventors have developed a process for selectively pre-exposing the printing element instead of pre-exposing the entire printing surface as is traditionally done in the prior art.

For example, U.S. Pat. No. 5,455,416 to Zertani et al., herein incorporated by reference in its entirety, describes a pre-exposure device for "pre-sensitizing" printing elements that are to be imagewise exposed. The pre-exposure device of Zertani et al. is said to generate a very uniform exposure intensity over the working width of the printing form.

In the practice of instant invention, the pre-sensitization (or bump exposure) step is used selectively to bump mostly in fine feature areas, leaving the shadow tones and reverse text areas mostly or completely un-pre-sensitized, resulting in less fill in of the shadow tones.

In one embodiment, the bump exposure step is accomplished through a film or negative that provides for varying levels of opacity in accordance with the final image desired. Areas of the film where discrete raised features are to be established are substantially transparent and areas of the film that are to be developed away are substantially opaque to the actinic radiation. Total areas range between substantially transparent to substantially opaque. This severely reduces the bump exposure in the shadow and reverse text areas while allowing the fine feature areas to be adequately pre-sensitized, and thereby produces an effective result.

In an alternate embodiment, the bump exposure step is accomplished using a laser-based CTP device. Beam intensity and position are highly controlled in such a device, so applying a preferential pre-sensitization with the laser beam may be advantageous, particularly in a multi-beam device. In one embodiment, the CTP device digitally projects an image onto a printing element. The pattern itself can be in the form of dots or linework generated by the computer.

In further embodiments, the photopolymer can be selectively pre-exposed using a micromirror based device such as those available from Basys Print GmbH or an LED array. The Basys Print device can project an inverted image at low dose actinic radiation to selectively pre-sensitize the plate followed immediately by a full exposure of the desired image at the higher main dose of actinic radiation. The initial inverted image (as used herein "inverted image" means an intensity inversion as compared to the intensity pattern used to finally image the photopolymer. Thus in the inverted image, areas that receive the most intensity in the curing step receive the lowest intensity and visa versa) reduces the bump in shadow areas while pre-sensitizing the areas with fine features. Alternatively a light emitting diode (LED) array can be used to selectively pre-sensitize certain areas of the photopolymer. By controlling the intensity of individual diodes in the array, an accurate and predictable selective pre-sensitization can be achieved.

Regardless of the method used (film, laser, micromirror, LED array, or other equivalent) the basis of this invention is the selective pre-sensitization of the photopolymer to remove unwanted oxygen particularly in areas where fine features need to be developed. Thus the relative intensity of the actinic radiation reaching the photopolymer for pre-sensitization is controlled so that little or no pre-sensitization radiation reaches shadow areas while greater amounts of pre-sensitization radiation reaches areas where fine features must be developed. The pre-sensitization exposure is then quickly followed by the main imaging exposure which can be accomplished through a variety of methods as disclosed in the art.

The invention will now be described by reference to the following non-limiting examples.

EXAMPLE 1

Image resolution tests were performed to determine the effect of the selective bump exposure on the resolution of the polymerized image by comparison with a plate exposed by conventional methods. The NAPPFLEX HS-2 (available from Napp Systems, Inc. of San Marcos, Calif.) photopolymer printing elements were used for these experiments. These printing elements consist of a thin layer of photopolymer on a steel substrate. These plates were made to a standard resin relief thickness (i.e., about 0.015 inches). A standard test negative is used to evaluate image resolution as plates are exposed in an OV-45 Olec exposure unit. The selectivity of the bump exposure in this example was produced by using a film positive of the standard test negative as a selective filter. This produces a higher bump dose in the highlight areas where it is most needed (because the film positive is mostly transparent in these areas) and a lower bump dose in the shadow areas where it is least needed (because the film positive is mostly opaque in these areas).

The plates received bump and main exposures which yielded the minimum highlight dot required (a 3% highlight at 100 lines per inch halftone screen). Reverse depths were then measured for comparison of the selective bump method with the typical exposure method (greater reverse depths indicate higher quality). Table 1 shows the exposure times as well as the 60% mid tone depths and the 4-point reverse text depths.

TABLE 1

| Bump Exposure ("Low" Lamp Setting (sec)) | Main Exposure ("High" Lamp Setting (sec)) | 60% Depths (mils) | 4-pt reverse text depths (mils) |
|---|---|---|---|
| Conventional Exposure Method | | | |
| 3.6 | 5.6 | 1.92 | 1.50 |
| Selective Bump Exposure Method | | | |
| 4.6 | 5.6 | 2.89 | 2.9 |

Minimum dot % is the minimum size highlight dot which the imaged resin can hold and print. Highlight dot holding is a critical measurement of a resin's performance. Print quality improves with finer features (i.e., lower % highlight dots).

The depth of the reverse images on the exposed plate are often qualitatively evaluated but can also be measured with a measuring microscope in the laboratory. Excellent reverse depth indicates a resin which has deep reverse areas with little "fill in" from surrounding resin. Reverse depth is important in producing a print with clean, sharp detail and lettering.

Reverse quality provides a measurement of the cleanliness of the edges of the reverse image. A resin with excellent reverse quality will have sharp, clearly defined letters and shadow areas, while areas between highlight dots will be clear.

What is claimed is:

1. A method of producing a relief image printing element comprising:
   providing a photosensitive printing element, said photosensitive printing element comprising a photosensitive layer disposed on a base substrate, wherein a desired image is creatable in a surface of said photosensitive layer by selectively curing said surface to create cured and uncured areas in said surface of said photosensitive layer;
   selectively pre-exposing portions of said surface of said photosensitive layer with actinic radiation at a selected first intensity of a radiation source to quench dissolved oxygen in the selectively pre-exposed portions of the photosensitive layer prior to imagewise exposure wherein the selected first intensity is not an intensity that cures the photosensitive layer;
   selectively imagewise exposing said surface of said photosensitive layer with actinic radiation at a selected second intensity of said radiation source to create cured and uncured areas; and
   selectively removing uncured portions of the photosensitive layer to reveal the relief image;
   whereby the selective pre-exposure of the photosensitive layer provides increased definition of the relief image surface.

2. The method according to claim 1 wherein the radiation source is a laser.

3. The method according to claim 2, wherein the laser is an ultraviolet laser.

4. The method according to claim 1 wherein said portions of said surface are selected from the group consisting of highlight dots, isolated dots, fine lines, and one or more of the foregoing.

5. The method according to claim 1, wherein said pre-exposing step is performed through a film or negative that provides for varying levels of opacity in accordance with a desired final image.

6. The method according to claim 5, wherein the radiation source is selected from the group consisting of arc lamps, fluorescent lamps, plasma lamps, and light emitting diodes.

7. The method according to claim 1, wherein the pre-exposing step is performed using a radiation source selected from the group consisting of lasers, LED arrays, and other focused actinic radiation beam sources, wherein intensity and position of the radiation source are controlled, whereby a preferential pre-exposure of the portions of the surface of the photosensitive layer is achieved.

8. The method according to claim 7, wherein the laser is used to project an inverted image of a desired pattern on the surface of the photosensitive layer using the first intensity of the laser, wherein the inverted image has an intensity inversion as compared to the second intensity used to imagewise expose the photosensitive layer, whereby areas that receive the lowest intensity during the pre-exposing step receive the most intensity during the imagewise exposing step.

9. The method according to claim 8, wherein immediately after the pre-exposing step, the photosensitive layer is exposed to the laser in an image of the desired pattern on the surface of the photosensitive layer at the second intensity of the laser.

10. The method according to claim 9, wherein the second intensity is between about 20 mJ/cm$^2$ and about 2000 mJ/cm$^2$.

11. The method according to claim 9, wherein the radiation is applied at the second intensity for about 30 nanoseconds to about 3 microseconds.

12. The method according to claim 8, wherein the first exposure dose, received by the fine feature areas, is between about 5 mJ/cm$^2$ and about 250 mJ/cm$^2$.

13. The method according to claim 8, wherein the radiation is applied at the first intensity for about 1 millisecond to about 5 seconds.

* * * * *